US012748791B2

(12) United States Patent
Berg et al.

(10) Patent No.: US 12,748,791 B2
(45) Date of Patent: Sep. 29, 2026

(54) SCALABLE GENERATIVE AI-BASED TOOL INFRASTRUCTURE

(71) Applicant: Microsoft Technology Licensing, LLC, Redmond, WA (US)

(72) Inventors: Erik William Berg, Portland, OR (US); Yash Jayesh Dagli, Kirkland, WA (US); Amber Elisabeth Telfer Norris, Hillsboro, OR (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 18/680,991

(22) Filed: May 31, 2024

(65) Prior Publication Data

US 2025/0298825 A1 Sep. 25, 2025

Related U.S. Application Data

(60) Provisional application No. 63/567,558, filed on Mar. 20, 2024.

(51) Int. Cl.

| | |
|---|---|
| ***G06F 16/00*** | (2019.01) |
| ***G06F 11/362*** | (2025.01) |
| ***G06F 16/334*** | (2025.01) |
| ***G06F 16/338*** | (2019.01) |
| ***G06F 30/31*** | (2020.01) |
| ***G06F 30/3323*** | (2020.01) |
| ***G06F 30/398*** | (2020.01) |
| ***G06F 40/40*** | (2020.01) |
| ***G06N 3/0475*** | (2023.01) |

(52) U.S. Cl.
CPC ........ *G06F 16/3347* (2019.01); *G06F 11/362* (2013.01); *G06F 16/338* (2019.01); *G06F 30/31* (2020.01); *G06F 30/3323* (2020.01); *G06F 30/398* (2020.01); *G06F 40/40* (2020.01); *G06N 3/0475* (2023.01)

(58) Field of Classification Search
None
See application file for complete search history.

(56) References Cited

U.S. PATENT DOCUMENTS 10,809,984 B2 * 10/2020 Mizrahi ................ G06F 40/242
11,194,815 B1 * 12/2021 Kumar .............. G06F 16/24552
11,481,211 B1 * 10/2022 Karri ......................... G06F 8/10
(Continued)

OTHER PUBLICATIONS

Luan, Sifei, et al. "Aroma: Code recommendation via structural code search." Proceedings of the ACM on Programming Languages 3.OOPSLA (2019): 1-28. (Year: 2019).*
(Continued)

*Primary Examiner* — Polina G Peach
(74) *Attorney, Agent, or Firm* — Seed Intellectual Property Law Group LLP

(57) ABSTRACT

Embodiments of the present disclosure include a formal verification method comprising a plurality of custom generative AI-based tools configured in a bottoms up methodology to generate formal verification code using an LLM. In another embodiment, the present disclosure includes a generative AI-based tool architecture comprising an index of code examples. A query from a user is used to retrieve code examples, and the query and code examples are sent to an LLM to generate code corresponding to the query.

20 Claims, 12 Drawing Sheets

(56) References Cited

U.S. PATENT DOCUMENTS

| | | | | |
|---|---|---|---|---|
| 11,681,541 | B2 * | 6/2023 | Mostafa | G06F 8/751 717/106 |
| 11,836,069 | B2 * | 12/2023 | Balasubramanian | G06F 8/74 |
| 12,073,195 | B2 * | 8/2024 | Duan | G06F 40/274 |
| 12,271,710 | B2 * | 4/2025 | Schaefer | G06F 8/33 |
| 12,340,191 | B1 | 6/2025 | Serban | |
| 12,566,926 | B2 | 3/2026 | Hsu | |
| 2010/0106705 | A1 * | 4/2010 | Rush | G06F 8/36 707/723 |
| 2018/0196731 | A1 * | 7/2018 | Moorthi | G06F 11/3688 |
| 2020/0097261 | A1 * | 3/2020 | Smith | G06F 40/174 |
| 2021/0200958 | A1 * | 7/2021 | Liu | G06N 3/08 |
| 2021/0390418 | A1 * | 12/2021 | Mass | G06N 3/08 |
| 2022/0043738 | A1 * | 2/2022 | Mahajan | G06F 11/0793 |
| 2022/0405336 | A1 * | 12/2022 | Lippe | G06F 16/9535 |
| 2023/0042051 | A1 * | 2/2023 | Clement | G06N 3/091 |
| 2023/0222393 | A1 * | 7/2023 | Zahm | G06F 40/35 706/12 |
| 2024/0070270 | A1 * | 2/2024 | Mace | G06F 21/552 |
| 2024/0134614 | A1 * | 4/2024 | Bakshi | G06F 8/65 |
| 2024/0256423 | A1 * | 8/2024 | Zhang | G06F 8/71 |
| 2024/0265281 | A1 * | 8/2024 | Hart | G06F 40/58 |
| 2024/0281222 | A1 * | 8/2024 | Trummer | G06F 16/3344 |
| 2024/0289124 | A1 * | 8/2024 | Qiao | G06F 8/73 |
| 2024/0311093 | A1 * | 9/2024 | Schaefer | G06F 8/37 |
| 2024/0311582 | A1 * | 9/2024 | Schaefer | G06N 3/08 |
| 2024/0311652 | A1 | 9/2024 | Kulkarni | |
| 2024/0378306 | A1 * | 11/2024 | Lyle | G06F 21/6245 |
| 2024/0403005 | A1 * | 12/2024 | Friddle | G06F 8/35 |
| 2024/0403340 | A1 * | 12/2024 | Boxler | G06F 16/338 |
| 2024/0411666 | A1 * | 12/2024 | Chan | G06F 11/3624 |
| 2024/0419917 | A1 * | 12/2024 | Clement | G06N 3/045 |
| 2024/0419977 | A1 * | 12/2024 | Perez | G06N 3/006 |
| 2024/0428079 | A1 * | 12/2024 | Chen | G06N 3/09 |
| 2025/0005026 | A1 * | 1/2025 | Balasubramanian | G06F 16/248 |
| 2025/0005058 | A1 * | 1/2025 | Khosla | G06F 16/3344 |
| 2025/0007790 | A1 * | 1/2025 | Marwah | H04L 41/16 |
| 2025/0029114 | A1 * | 1/2025 | Stonehocker | G06N 5/046 |
| 2025/0117479 | A1 * | 4/2025 | Yang | G06F 8/75 |
| 2025/0173365 | A1 * | 5/2025 | Sivulka | G06F 16/3344 |
| 2025/0217265 | A1 * | 7/2025 | Hicks | G06N 3/08 |
| 2025/0238628 | A1 | 7/2025 | Sharma | |
| 2025/0278564 | A1 * | 9/2025 | Yuan | G06F 40/284 |
| 2025/0298721 | A1 | 9/2025 | Berg | |
| 2025/0298952 | A1 | 9/2025 | Berg | |
| 2025/0298955 | A1 | 9/2025 | Ramirez Beltran | |
| 2025/0363304 | A1 * | 11/2025 | Fortkort | G06F 40/284 |

OTHER PUBLICATIONS

Murr, Lincoln, Morgan Grainger, and David Gao. "Testing llms on code generation with varying levels of prompt specificity." arXiv preprint arXiv:2311.07599 (2023). (Year: 2023).*

Yu, Shengcheng, et al. "Llm for test script generation and migration: Challenges, capabilities, and opportunities." 2023 IEEE 23rd International Conference on Software Quality, Reliability, and Security (QRS). IEEE, 2023. (Year: 2023).*

White, Jules, et al. "A prompt pattern catalog to enhance prompt engineering with chatgpt." arXiv preprint arXiv:2302.11382 (2023). (Year: 2023).*

Nashid, Noor, Mifta Sintaha, and Ali Mesbah. "Retrieval-based prompt selection for code-related few-shot learning. " 2023 IEEE/ACM 45th International Conference on Software Engineering (ICSE). IEEE, 2023. (Year: 2023).*

Youtube: "60DAC Tech Talk: What ChatGPT and Generative AI means for Semiconductor Design and Development," Dactv, Retrieved from Link: https://www.youtube.com/watch?v=VJdQV87H1O4, Retrieved on Oct. 23, 2024, 2 pages.

U.S. Appl. No. 18/731,124, filed May 31, 2024.

U.S. Appl. No. 18/731,139, filed May 31, 2024.

U.S. Appl. No. 18/731,025, filed May 31, 2024.

Non-Final Office Action mailed on Apr. 29, 2026, in U.S. Appl. No. 18/731,139, 16 Pages.

* cited by examiner

SCALABLE GENERATIVE AI-BASED TOOL INFRASTRUCTURE

PRIORITY CLAIM

This application claims priority under 35 USC 119(e) to U.S. Provisional Patent Application Ser. No. 63/567,558, filed Mar. 20, 2024, all of which is incorporated herein by reference in their entirety.

BACKGROUND

The present disclosure relates generally to scalable generative AI-based tool infrastructures and in particular to an application of a scalable generative AI-based tool infrastructure for digital circuit verification.

Verification systems typically involve software for performing a variety of tests on circuitry during development of the circuits. For example, digital systems may comprise a wide variety of digital features and functions. Such systems are commonly developed using a high level definitional language (HDL), such as Verilog. Verilog code, for example, may define the behavior of the system. Prior to physical construction of the digital circuits, the digital system may be represented as one or more software files. These digital representations of the digital circuit are then tested to verify that the system performs the features and functions specified by a design specification. This process is commonly referred to as verification.

Verification may involve generating inputs and observing outputs to confirm the digital system behaves as desired. One method of verification is formal verification. Formal verification is a verification methodology where the behavior of a system proved or disproved with respect to a formal specification or property, which may be expressed as mathematical expressions, for example.

Building verification systems is time consuming and expensive process that typically requires expert knowledge.

DETAILED DESCRIPTION

Figure 1:
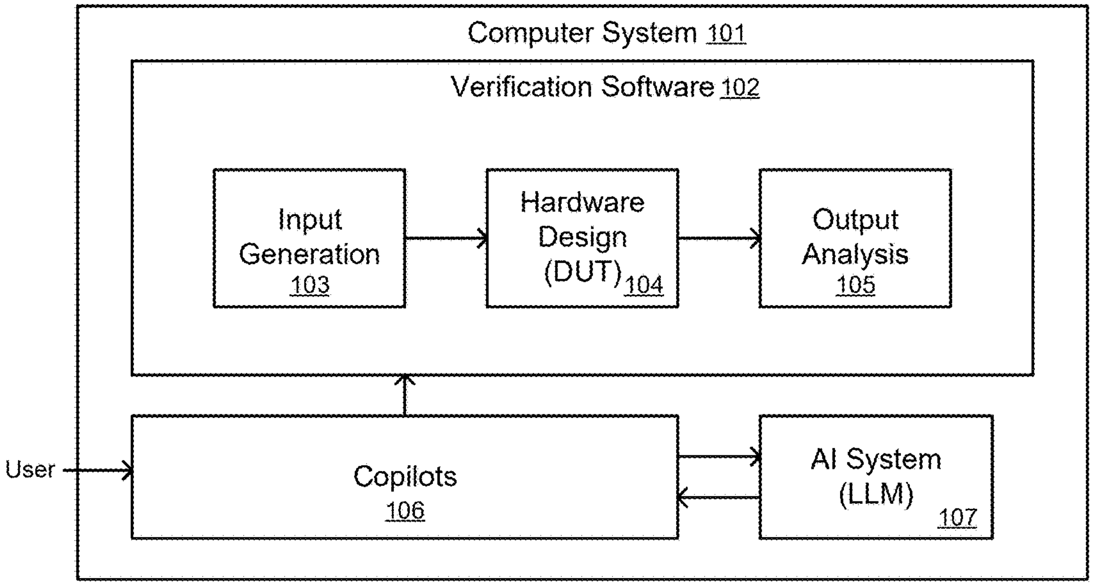
FIG. 1 illustrates verification according to an embodiment.

Described herein are techniques for verification. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein. While verification is described here as one example, it is to be understood by those skilled in the art that the scalable generative AI-based tool infrastructure described herein has many applications where a generative AI-based tool may be useful in improving the quality of an LLM's generated responses. A generative AI-based tool can be designed for generating domain specific code syntax that may not be well understood by LLMs.

Embodiments of the disclosure include a tool that leverages generative artificial intelligence to create portions of a verification testbench syntax and reduce the time and cost of development. In one embodiment, the present disclosure includes a formal verification generative AI-based tool that generates a formal verification testbench for a system Verilog design module. In certain embodiments, various generative AI-based tools may include some or all of the following. For example, the system may include a generative AI-based tool to convert natural language descriptions of assertions to system Verilog assertion syntax. A generative AI-based tool may provide a set of example assertions in a Retrieval Augmented Generation (RAG) process to improve the quality of the generated assertion code. A generative AI-based tool may map the assertion descriptions to the required signals in the Verilog design module. A generative AI-based tool may generate a system Verilog module that contains the generated assertion syntax. A generative AI-based tool may generate the module interface without user guidance. The generated module may have the correct signal declarations based on the signals consumed in the assertion properties. A generated module may have the correct parameter declarations based on the parameters used in the assertion properties. A generative AI-based tool may provide a set of example modules generated from assertions in a RAG process to improve the quality of the generated module code. A generative AI-based tool may generate a system Verilog module to bind the module containing the assertions to the Verilog design module. A generative AI-based tool may provide a set of example bind modules generated from system Verilog modules in a RAG process to improve the quality of the generated module code. A generative AI-based tool may consume the file defining the build flow and provide the user with options for where to include the generated system Verilog property module and the generated system Verilog bind module in the build collateral. A generative AI-based tool may provide an interface for users to specify Verilog design module configurations based on the parameters in the design module Parameters may be discovered by the generative AI-based tool and not explicitly provided by the user. A generative AI-based tool interface may provide the user with the capability to specify desired parameter values for each configuration the user needs to test. Each set of configuration settings may provide a different test instance. A generative AI-based tool may identify clock and reset signals in the Verilog design module and then interview the user to define the correct clock frequency and reset active state. A generative AI-based tool may interview the user for any assumptions or constraints that should be included in an input test file (e.g., a "tcl" test file) and then generate the appropriate syntax. A generative AI-based tool may enable the user to either regenerate or accept generated collateral for some or all steps described above. A generative AI-based tool may enable the user to provide custom RAG collateral for some or all steps described above. The collateral generated by the generative AI-based tool may include: a generated assertion module, a generated bind module, an updated build file, a generated configuration parameter files, a generated input test file (e.g., a "tcl" test files) for various configuration instances, and command ("Cmd") lines for running the tcl test files formal verification tool, such as the "VC Formal" tool by Synopsys®, for example.

FIG. 1 illustrates a verification system 102 according to an embodiment. Verification software system 102 may execute on a computer system 101, which may include one or more computers, cloud computers, virtual machines or the like that include one or more processors (e.g., central processing units (CPUs) and or customized processors for performing AI functions) and memory (e.g., DRAM, SRAM, non-volatile memory, and the like). Verification software 102 includes a hardware design 104 (aka, a design module or device under test (DUT)), which is a digital representation of a digital circuit being constructed. Verification software 102 includes input generation 103 to generate inputs to design 104 and output analysis 105 to receive outputs generated by design 104 and determine if the outputs conform to the desired functionality and/or specification, for example. In various embodiments described herein, verification software 102 interacts with one or more generative AI-based tools 106 as described in more detail below. In various embodiments, generative AI-based tools 106 may generate customized inputs 110 (aka, prompts) to an artificial intelligence (AI) system 107. AI system may be a large language model (LLM), for example, configured to perform generative AI functions such as publicly available generative AI from GPT-4 by OpenAI®, for example. In other examples, the AI system may be a private LLM, thus providing security and privacy to the data being provided to, and being received from, the LLM. In various embodiments, a user may interact with generative AI-based tool(s) 106 to streamline and automate generation of verification code for verifying a particular design 105, such as input generation 103 and/or output analysis 104, for example. The generative AI-based tool framework includes an index that stores entries containing relevant information for a given programing task or domain. Examples of the relevant information stored in the entries include code snippets, API references, and code examples. The entries may be used as part of the input to the LLM 107 so that the quality of the output of the LLM is improved. While circuit verification is one use case for the generative AI-based tools and the LLM, there are many other applications where a generative AI-based tool in conjunction with an LLM may be able to provide higher quality output in comparison to the LLM alone.

Figure 2:
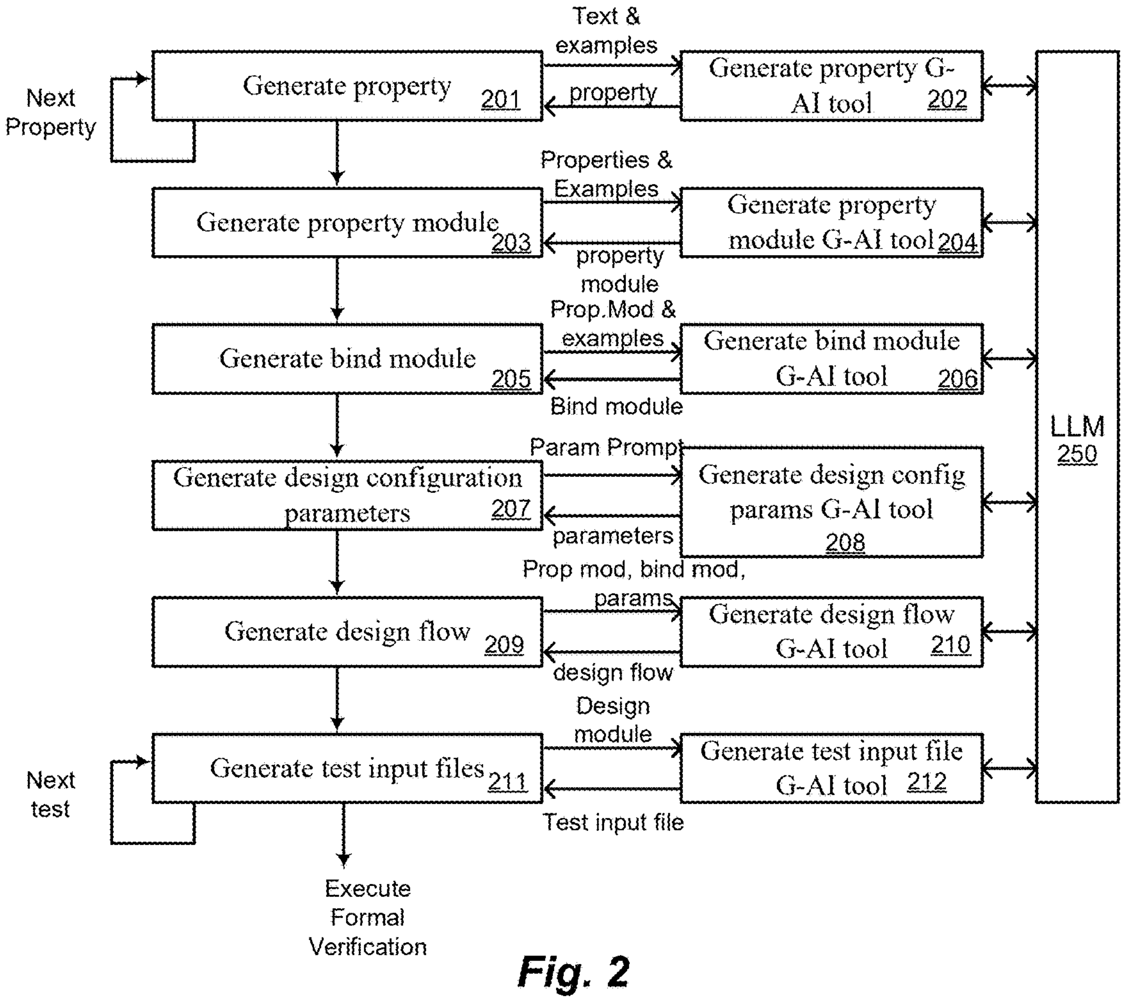
FIG. 2 illustrates a verification process according to an embodiment.

FIG. 2 illustrates a verification process according to an embodiment. As described further below, one embodiment of the present disclosure includes a plurality of customized generative AI-based tools for generating a formal verification system (aka, a testbench) for a particular design module to be tested. As shown here, the formal verification system consists of many different parts to be generated (201, 203, 205, 207, 209, 211) and each part may have its own corresponding syntax. The syntaxes may be different so therefore each part may include its own generative AI-based tool which may be trained specifically the syntax of that part of the formal verification system. Features and advantages of the present disclosure include a "bottom up" methodology, where properties are generated using a property generative AI-based tool 202, a property module is generated using a dedicated property module generative AI-based tool 204, a bind module is generated using a bind module generative AI-based tool 206, design configuration parameters are generated using a design configuration parameters generative AI-based tool 208, a design flow is generated using a design flow generative AI-based tool 210, and test input files are generated using a test input file generative AI-based tool 212. The test files may be executed to perform a formal verification of the design file (DUT), for example.

In certain embodiments, the generative AI-based tools guide a user who may be unfamiliar with the process for generating a formal verification testbench from property generation to the creation of tests quickly and efficiently. Previously this required training, documentation, and many manual steps to complete. The generative AI-based tool may also assist in editing information provided by the user such as commands so that the information is in the proper syntax. These are some of the advantages of the generative AI-based tool infrastructure.

Initially, in one example embodiment, a data object may be created for storing outputs that is visible to all the generative AI-based tool components. This object contains the name of the project consisting of all the generated output, the design module (e.g., the DUT) that the generated content applies to, and the name of the directory where the output collateral will be stored. Each of the steps may include a unique generative AI-based tool that performs unique prompt engineering, for example.

At 201, properties are generated from natural language descriptions provided by the user. These properties may be stored in the data object. Properties are known components of the Verilog design language. Properties may be used to define a property of the circuit under test that must hold true for the circuit to be validated. As a simple example, one property may be that there will never be two (2) reads on consecutive clocks. If you detect two (2) reads on consecutive clocks, the circuit is not validated.

In some embodiments, comments may be automatically copied from a circuit specification document (e.g., assertions, or things about the design that are intended to be true), and the comments may be input to an LLM to generate properties having the correct syntax. Generate property generative AI-based tool 202 may be configured to generate a custom script comprising a textual description of the property to be generated, together with one or more examples of textual descriptions and corresponding correct property syntax, for example. Accordingly, generate property generative AI-based tool 202 may generate properties for a piece of design code from the natural language description of property (e.g., a comment from the specification) and pieces of example text and corresponding example code in the prompt to an LLM 250. LLM 250 generates individual properties corresponding to the textual descriptions and conforming to the property syntax provided with the text. A user may repeat this process for multiple properties used to verify the DUT, for example.

Once the individual properties are autogenerated, a property module may be generated at 203. A property module includes, for example, user-defined combinations of generated properties. The property module may comprise one or both of assumes (formal verification inputs) or asserts (formal verification outputs). Selected properties generated at 201 may be input into LLM 250 to create a complete properties module, which may comprise module syntax and signal properties such as signal logic and/or parameter logic (e.g., bus or register widths, register settings, flags, and the like). Accordingly, properties module generative AI-based tool 204 may be configured to receive properties generated at 201, together with example properties and correct syntax for corresponding example property modules. Generate property module generative AI-based tool 204 may be configured to build a custom property module prompt, which is sent to LLM 250. LLM 250 autogenerates a property module comprising the properties generated at 201 and code for implementing the properties in a test bench, for example. In one embodiment, the generated property module from LLM 250 may be written to a file in an output directory specified in the data object or added to the data object mentioned above (or both), for example.

Next, at 205, a bind module is generated. A bind module connects the property module to the design module, for example. The bind module may include user-defined combinations of generated property modules (e.g., which may be stored in the data object). Once binding is performed, property modules may be attached to the design module, and once attached, may feed signals from the design module into the property module, for example. The properties module, in turn, determines if any properties are being violated. Binding 205 may include sending one or more property modules and examples of property modules and correct binding modules to bind module generative AI-based tool 206, for example. Generative AI-based tool 206 generates a bind module for the input property module(s) conforming to the examples. The generated bind module may be written to a file in the output directory specified in the data object or added to the data object (or both), for example.

Next, at 207, default configuration parameters for the design module may be specified. In one embodiment, default configuration parameters are retrieved from the design module. These parameters may set values for signals, digital structures, and other aspects of the design and properties. Configuration parameters may define configurations for tests to be run, for example. There may be a one-to-one relation between configurations and input test files generated. In some embodiments, configuration parameters may change the design architecture on the fly during the design and verification process, for example. Generative AI-based tool 208 may be configured to receive a natural language query, Verilog and system Verilog design modules, Verilog and system Verilog design code snippets, code snippets from other non-Verilog languages, customized instructions to the LLM, error messages from log files, signal structure description. LLM 250 may be used to read the design module and extract out the parameter names and default values. For example, generative AI-based tool 208 may construct a prompt to LLM 250 and produces functional code satisfying the natural language query. This may include newly generated code and/or repairs to existing code supplied as part of the prompt. In one embodiment, parameters for the design module are specified in the data object and read by the LLM and presented in a GUI window to the user. The user can then create new configurations and store them in the data object with user-defined labels.

Next, at 209, a design flow is generated. The design flow, which is also referred to as a build recipe (e.g., a "compile.yml"), is a file that contains the build recipe for the design under test (DUT). Design flow generative AI-based tool 210 is configured to read a design flow file and allows the user to choose which parts of the build flow will include the generated property modules and generated bind modules. A compile.yml file may then be saved by the verification software tool, for example. In some embodiments, the design flow may be a simple script such as a python script and therefore, may not connect to a generative AI-based tool.

Test input files are generated at 211. An example test input file is a "tcl" file, which is the test that the verification system will run that will employ all the information generated at steps 201-210 above. A generate test input file generative AI-based tool 212 may read in clocks and reset signals from the design module specified in the data object, for example, and allow the user to do the following: choose which reset signals will be used in the test, choose active high or active low for reset signals, choose the clock or clocks that will be used in the test, and choose the frequency of the clock or clocks that will be used in the test, for example. Generative AI-based tool 212 may present these items and a user may specify clocks, frequencies, and reset signals (active high or low). In one embodiment, LLM 250 may identify clock signals and reset signals for generate test input file generative AI-based tool 212. In another embodiment, LLM 250 may provide available parameters to generate test input file generative AI-based tool 212. Generative AI-based tool 212 constructs a test input file (e.g., each tcl file is a test) for each configuration specified by the user employing the generated bind module specified by the user and may create a README file that defines the command line to run every generated test, for example. In one embodiment, the test input file may contain a script that is going to be consumed by the formal verification tool.

Figure 3:
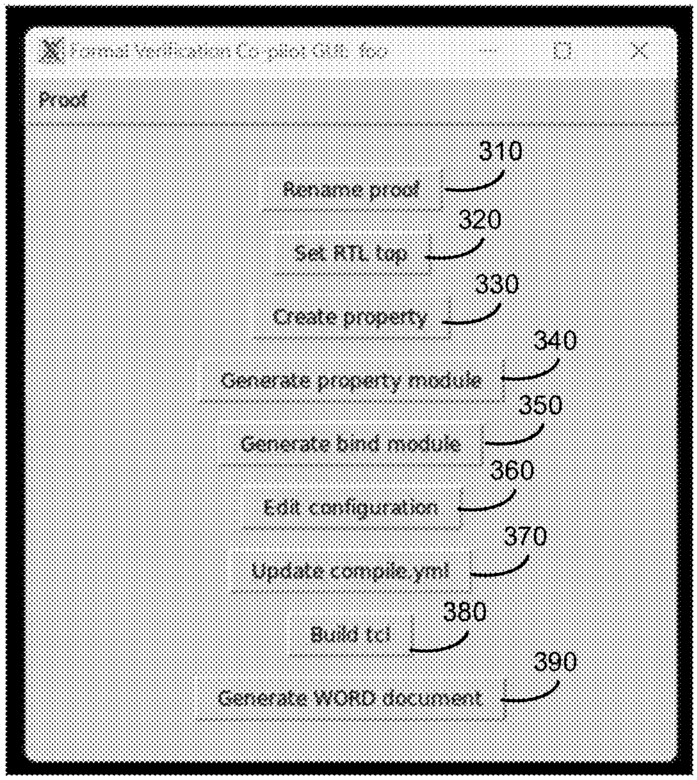
FIG. 3 illustrates an example formal verification generative AI-based tool graphical user interface according to an embodiment.

FIG. 3 illustrates an example formal verification generative AI-based tool graphical user interface (GUI) according to an embodiment. The GUI may be presented to a user to guide the user through the process of generating a script to be read by the formal verification tool. This may be particularly useful for users who are not as experienced with the formal verification workflow. The GUI includes a button 310 to "rename proof" (e.g., allowing a user to change the default naming convention for generated files) and a button 320 to "set RTL top" (e.g., to set the context for the LLM by choosing the design code that formal verification assertions will be written for). GUI also includes button 330 to "create property" which is created in the context of RTL top. In one example clicking button 330 may execute generate property 201 in FIG. 2. GUI also includes button 340 to "generate property module." The property module may be generated based on the created properties in the step above. In one example clicking button 340 may execute property module 203 in FIG. 2. GUI also includes button 350 to "generate bind module" which generates syntax to bind the generated module from above to RTL top and to connect signals across the interface. In one example clicking button 350 may execute generate bind module 205 in FIG. 2. GUI also includes button 360 to "edit configuration." Edit configuration allows the user to set parameter values for different configurations. For example, the user may want to run the proof for minimum specified FIFO depth, FIFO depth powers of two, and maximum specified FIFO depth to name a few. In one example clicking button 360 may execute generate design configuration parameters 207 in FIG. 2. GUI also includes button 370 to "update compile.yml" which adds the generated property modules and bind modules into the build flow. In one example, clicking button 270 may execute generate design flow 209 in FIG. 2. GUI also includes button 380 to "build tcl file" which is the script that is going to be consumed by the formal verification tool. In one example, clicking button 380 may execute generate test input files 211 in FIG. 2. GUI also includes button 390 which generates a Word document as described above when the button is clicked.

Figure 4:
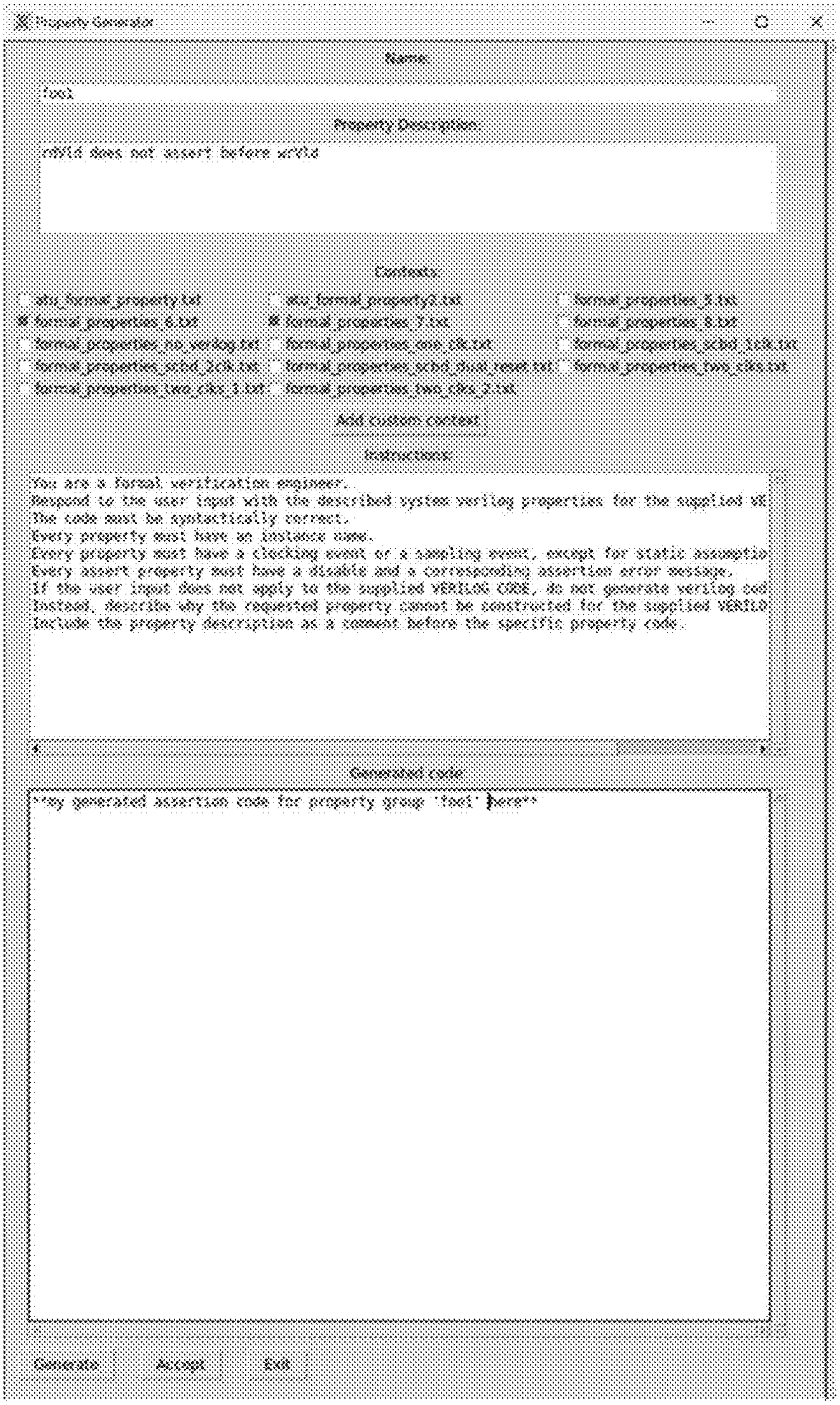
FIG. 4 illustrates an example property generator generative AI-based tool graphical user interface according to an embodiment.

FIG. 4 illustrates an example property generator generative AI-based tool graphical user interface according to an embodiment. This GUI may be a part of generate property generative AI-based tool 202 in FIG. 2. This GUI includes a property name, description of the property, and user selected contexts (example properties) provided as example inputs to the LLM to produce an accurate output. The GUI further includes instructions to the user and a field for the autogenerated properties output by the LLM, for example. The formal verification property generation generative AI-based tool of FIG. 4 includes property group name text window. Text entered in the name window may be used to tag the rest of the content inside a data object, for example. The property description text window comprises text describing the property or properties to be generated. Contexts in this example comprise a set of files that were written to provide example code as part of the prompt to improve the results generated by the LLM. The user may choose which files to include in the prompt based on the syntax that the user wanted to get back from the LLM, for example. The instructions text window may include instructions given to the LLM that define its role and the structure and syntax of the desired response. This is prepopulated by the generative AI-based tool author but can be edited by the user. Generated code text window includes the response from the LLM for the query. This may be editable before it is added to the data object because the user may want to tweak the response from the LLM to fix any syntax or style issues. The "Generate" button, when selected, sends the query to the LLM. The query is constructed from the property description, selected contexts, and the instructions. The "Accept" button may commit the generated code to the data object, for example. An "Exit" button may be used to exit the property generation GUI. In some embodiments, the GUI may further include additional buttons along the bottom next to the "Generate", "Accept", and "Exit" buttons. For example, a "View RAG Entries" button may present entries retrieved from the index of the generative AI-based tool. The entries may be presented in a pop-up window. This may be advantageous because the user would be able to view and provide feedback on the entries retrieved from the index that were used as part of the prompt for the LLM to create the generated code. Feedback may include analyzing the quality of the entries, where poor quality entries may be removed, thereby improving the performance of the index over time. As another example, a "Update Index" button may be used to commit new entries stored in blob storage to the index so that they are accessible in future queries. In one embodiment, new entries are automatically committed to the index whenever the accept button is selected, signifying that the user has accepted the generated code. In another embodiment, new entries are stored in blob storage when the accept button is selected. A batch of new entries may be committed to the index when the "Update Index" button is selected. This may be useful in implementations where updating the index every time generate code is accepted is not practical. For purposes of scalability and consistency, the bottom portion of the GUI starting from "Generated code" text may be consistent in the GUI of all generative AI-based tools. This may be advantageous as it creates a uniform look and feel to the GUI. The top portion of the GUI that is above "Generated code" text may be configurable for each generative AI-based tool. The windows and fields present in the top portion may be dependent on the data sources that are being provided as input for a particular generative AI-based tool. For example, the property name, description of the property, user selected contexts, and instructions to the user may be specific to property generator generative AI-based tool.

Figure 5:
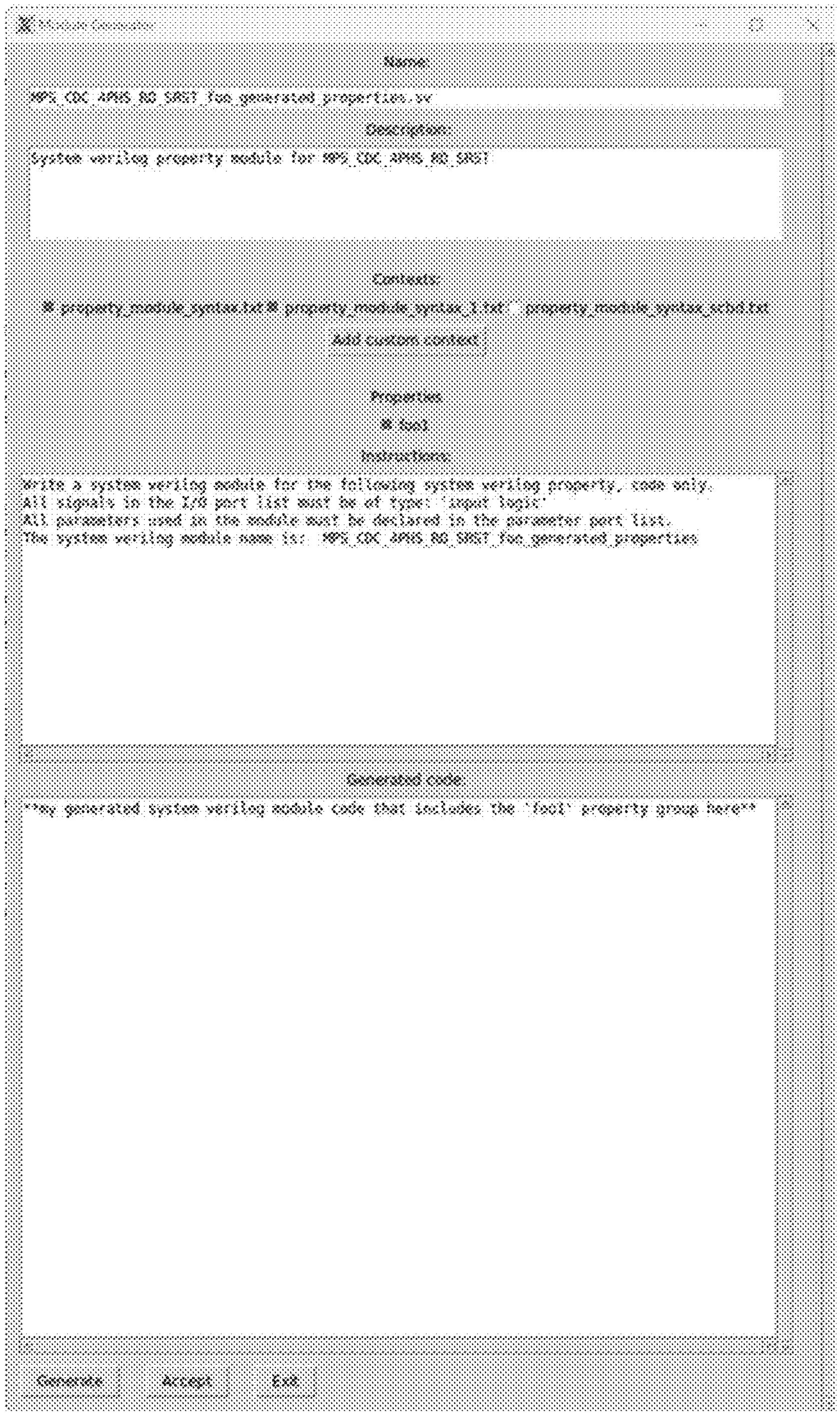
FIG. 5 illustrates an example module generator generative AI-based tool graphical user interface according to an embodiment.

FIG. 5 illustrates an example module generator generative AI-based tool graphical user interface according to an embodiment. This GUI may be a part of generate property module generative AI-based tool 204 in FIG. 2. This GUI includes a name of the property module to be generated, a description of the property module, and user selected context (example property modules) as well as instructions to the user. These fields above the "Generate code" text may be specific to the module generator generative AI-based tool. This generative AI-based tool automatically is configured to receive the properties generated by the GUI in FIG. 4. Generated property module code is output in the generated code portion of the GUI, for example. More particularly, the formal verification module generation generative AI-based tool illustrated in FIG. 5 consists of the following features. The module name text window the name of the module to be generated. The properties comprise the generated properties currently available (e.g., in the data object). The user can choose any or all of the properties to include in the generated module. The instructions text window comprises instructions given to the LLM that define its role and the structure and syntax of the desired response. This is prepopulated by the generative AI-based tool author but can be edited by the user. The generated code text window comprises the response from the LLM for the query. This is editable before it is added to the data object or written to a file because the user may want to tweak the response from the LLM to fix any syntax or style issues. The "Generate" button sends the query to the LLM. The query is constructed from the module name, selected properties, and the instructions. The "Accept" button commits the generated code to the data object and writes the module to a file. The "Exit" button exits the property module generation GUI. As mentioned above, appearance of the bottom portion of the GUI starting with the "Generate code" text may be consistent across all GUIs for the generative AI-based tools.

Figure 6:
FIG. 6 illustrates an example bind module generator generative AI-based tool graphical user interface according to an embodiment.

FIG. 6 illustrates an example bind module generator generative AI-based tool graphical user interface according to an embodiment. This GUI may be a part of bind module generative AI-based tool 206 in FIG. 2. This GUI includes a name of the bind module, a description of the bind module, user selected context (example bind modules), and instructions. This generative AI-based tool automatically is configured to receive the property module generated by the GUI in FIG. 5. This GUI includes an output window for generated bind module code. In this example, the formal verification bind module generation generative AI-based tool consists of the following features. A bind module name text window contains the name of the bind module to be generated. Modules includes the generated modules (e.g., currently in the data object). The user can choose any or all of the modules to include in the generated bind module. An instructions text window includes instructions given to the LLM that define its role and the structure and syntax of the desired response. This is prepopulated by the generative AI-based tool author but can be edited by the user. The generated code text window comprises the response from the LLM for the query. This is editable before it is added to the data object or written to a file because the user may want to tweak the response from the LLM to fix any syntax or style issues. The "Generate" button sends the query to the LLM. The query is constructed from the bind module name, selected modules, and the instructions. The "Accept" button commits the generated code to the data object and writes the bind module to a file. The "Exit" button exits the bind generation GUI. As mentioned above, appearance of the bottom portion of the GUI starting with the "Generate code" text may be consistent across all GUIs for the generative AI-based tools.

Figure 7A:
FIGS. 7A-C illustrate an example configuration parameter generative AI-based tool graphical user interfaces according to an embodiment.
Figure 7B:
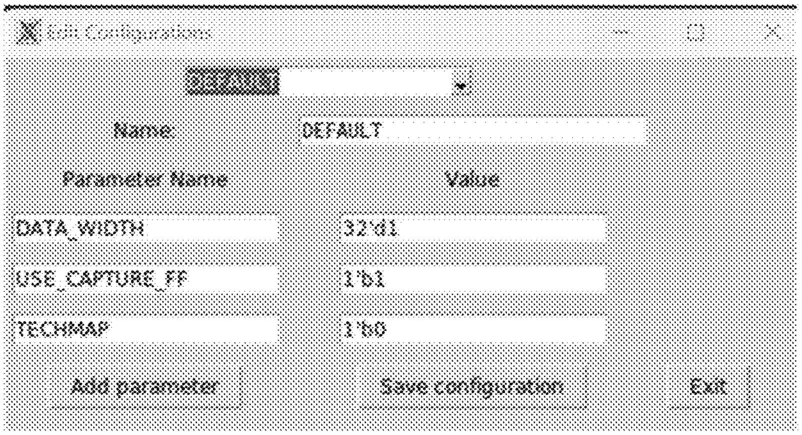
Figure 7C:
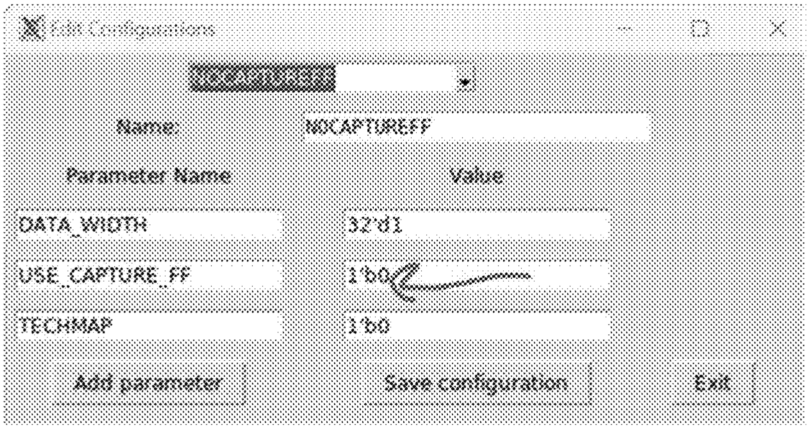

FIGS. 7A-C illustrate an example configuration parameter generative AI-based tool graphical user interfaces according to an embodiment. This GUI may be a part of generate design config params generative AI-based tool 208 in FIG. 2. The design configuration parameter (e.g., 'Edit Configuration') generative AI-based tool consists of the following features. The LLM reads the interface parameters for the design module, which may be identified in the data object, and presents them to the user in an editable window. The user can specify new configuration values and save them under a name, e.g., "CONFIG1". The user can save as many permutations of configurations as they want.

Figure 8A:
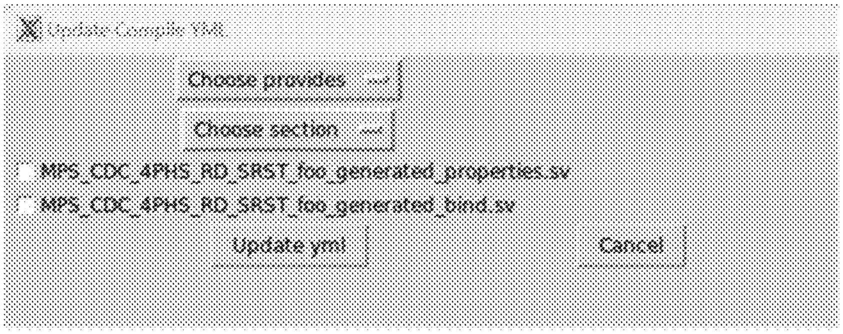
FIG. 8A-C illustrates an example design flow generation generative AI-based tool graphical user interface according to an embodiment.
Figure 8B:
Figure 8C:
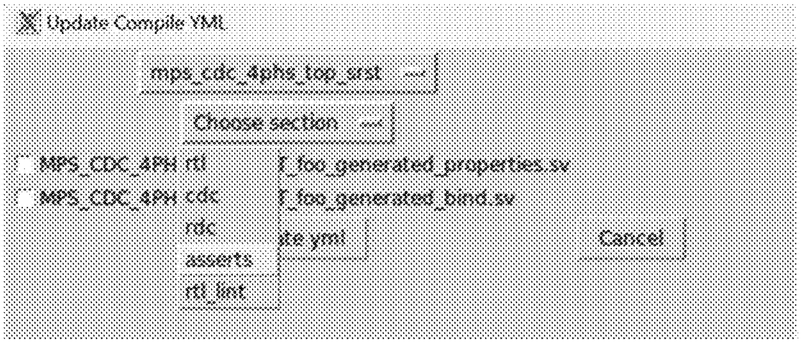

FIGS. 8A-C illustrates an example design flow generative AI-based tool graphical user interface according to an embodiment. This GUI may be a part of generate design flow generative AI-based tool 206 in FIG. 2. In this example, an 'Update compile.yml' generative AI-based tool is a python script with no LLM usage. Therefore, the design flow generative AI-based tool is not connected to an LLM. The compile.yml file is the build recipe for the design and verification collateral. The script does the following: First, the compile.yml is read and provides the user with the available options for where the generated collateral can be included in the build flow. After the user chooses the location in the compile.yml where the generated collateral will be integrated into the build flow, the file is saved and the script ends.

Figure 9:
FIG. 9 illustrates an example test input generation generative AI-based tool graphical user interface according to an embodiment.

FIG. 9 illustrates an example test input generation generative AI-based tool graphical user interface according to an embodiment. This GUI may be a part of generate test input file generative AI-based tool 212 in FIG. 2. In this example, a "Build tcl" generative AI-based tool is the final part of the tool that combines all the other components into the executable test collateral. The LLM reads a tcl template file that has placeholders for the clock, reset, and bind module information that needs to be defined for the test. The "Create tests" button generates a new tcl file that conforms to the user's selections. One (1) tcl file may be generated for each configuration created by the user—e.g., each "Edit Configuration" window above. Tcl files, when executed, compile the design with the above parameter values and collateral specified in build recipe and runs the formal verification engine to see if the properties can be falsified for a given design.

Figure 10:
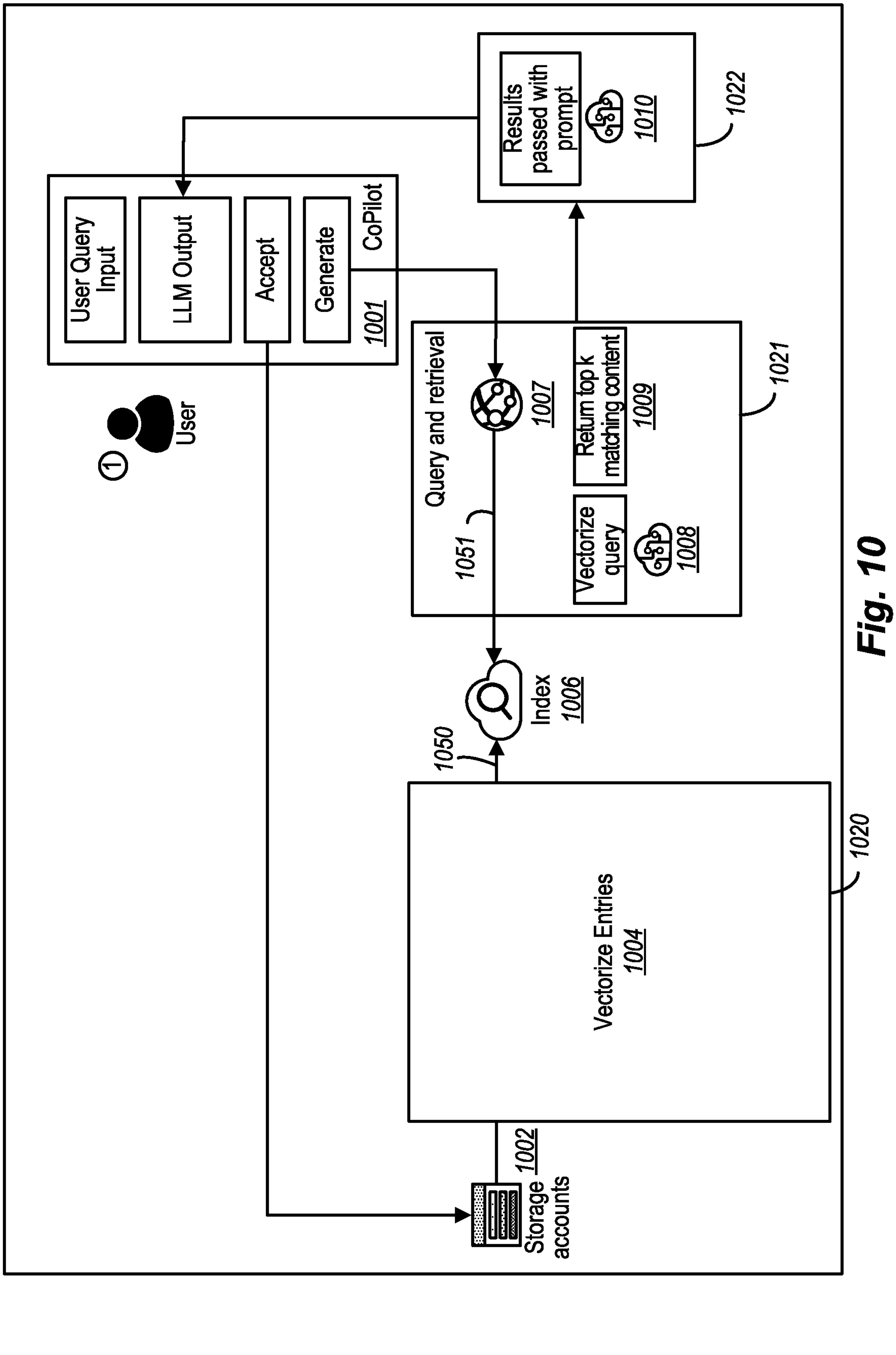
FIG. 10 illustrates an example generative AI-based tool architecture according to an embodiment.

FIG. 10 illustrates an example generative AI-based tool architecture according to an embodiment. In some embodiments the formal verification techniques described above, as well as other verification techniques, may use the following described generative AI-based tool architecture approach to improve the quality of LLM generated responses. Embodiments of the generative AI-based tool architecture described below may be designed for generating domain specific code syntax that is not well understood by traditional LLMs (e.g., functional coverage, formal verification, RTL assertions, DV LINT, and SKILL syntax). It is to be understood by those skilled in the art that the generative AI-based tool architecture approach described can also be used in many other applications to improve the quality of LLM generated responses, especially in applications where the LLM is not familiar with the code syntax desired in the LLM responses.

Embodiments of the present disclosure may include a retrieval augmented generation (RAG) framework that combines an LLM and an index. As illustrated in FIG. 10, the RAG system includes generative AI-based tool 1001, which sends the data that will be used for the RAG index lookup, an embeddings creation component 1020, a query and retrieval component 1021, and a LLM component 1022. Generative AI-based tool 1001 may receive a user query input, generate a modified query, receive an LLM output, and allow the user to accept or edit the LLM output. Query and retrieval 1021 may include an application service (interface) 1007, an embedding model 1008 (e.g. to generate a vectorized query for the index lookup using the LLM model embeddings). A vector is sent to the index 1006 at 1051. Index lookup occurs and relevant entries are returned from the index in a ranked list at 1009 depending on how closely they match the vector for the query. Query and retrieval 1021 allows generative AI-based tool 1001 to choose the maximum number of entries in the list that in total do not exceed a predefined number of tokens. Here, query and retrieval 1021 returns the top k matching entries. The input query can then be supplemented with the retrieved entries. In one embodiment, entries retrieved are added to the query (a.k.a. the modified query) and sent to the LLM 1022. At 1010, a response from the LLM is sent to the generative AI-based tool where it populates the output window for the user to view. In some examples, this output window is the "Generated code:" window of the generative AI-based tool's GUI. At 1002, a user either accepts the response as is or manually edits it before pressing 'Accept' button. All the generative AI-based tool fields are saved to the blob storage 1002 for this generative AI-based tool. At 1004, a vector for the entry is generated and a data object is constructed that contains the vector, date, user, and the query data. This output 1050 is then added to the index 1006. Advantages to storing the query data and the vector containing the LLM output accepted by the user include that the query-output pair can be used to further improve the quality of index 1006 since the index would contain more outputs that were accepted by the user, thereby improving the quality of future queries to index 1006.

The LLM may be a neural network that can generate natural language text based on a given input, such as a query or a prompt. An index is a collection of code snippets or documents that contain relevant information for a given programming task or domain, such as API references or code examples.

The index is used as a source of additional context and evidence for the LLM, and to integrate the retrieval and generation processes in a seamless way. In various embodiment, a RAG approach may work as follows.

Given an input query, such as a verification specification or a description, the LLM generates an initial representation of the query. The initial LLM generated query is used to retrieve a set of relevant entries from the index. The retrieval can be done using different methods, such as exact match, keyword search, or semantic similarity, for example. The output is evaluated using a scoring function, which takes into account both the quality of the generation and the relevance of the retrieval. The relevant entries may be ranked according to how well they match the input query. The generative AI-based tool infrastructure may choose the maximum number of entries from this list that can fit in a predefined token window. The scoring function can be learned from data, such as test cases or feedback, or predefined using heuristics or rules. The output with the highest score is selected as the final response.

The retrieved entries from the index are then fed back to the LLM as additional context, along with the original query. The LLM uses this augmented input to generate a refined output, such as a code snippet or a function, that incorporates the information from the index.

Using the currently described approach, the LLM can benefit from the additional information stored in the index, and produce more accurate, informative, and coherent code. The current techniques may further enable the LLM to handle a wider range of programming tasks and domains, without requiring extensive fine-tuning or adaptation. The currently described approach may be applied to various types of LLMs, such as autoregressive or autoencoding models, and various types of indices, such as textual or multimodal. Additionally, the RAG approach described here may help the LLM to follow coding styles, syntax, and conventions that are specific to a programming task or domain, by retrieving and generating code that is consistent with the index. For example, if the index contains code that follows a certain naming convention, indentation style, or documentation format, the LLM can use the retrieved entries as a reference and generate code that matches the same style and format. This can improve the readability, maintainability, and usability of the generated code.

In some embodiments, the index may be carefully curated, updated, and validated by a user for the specific programming task and domain. The generative AI-based tool infrastructure allows users access to the indexed entries affecting the responses to their prompts so that poor responses can be linked to bad index entries and potentially removed.

RAG, on the other hand, does not modify the parameters of the LLM, but rather augments the LLMs input with external knowledge sources. RAG can enhance the capabilities of the LLM without compromising its generality or diversity, and it can leverage unlabeled or weakly labeled data, such as web pages or code repositories, which are more abundant and accessible than labeled data. RAG may be cheaper to deploy and allows the generative AI-based tool infrastructure to leverage individual indices for domain-specific tasks.

In one example implementation, a scalable generative AI-based tool architecture may include a GUI frontend built from a class-based, widgetized code structure. A portion of the GUI comprised of the "Generated code" window and the buttons at the bottom may, in some example embodiments, be standard for generative AI-based tools, and may contain the connections into the RAG infrastructure. The top portion of the GUI may be customizable based on the data provided by the user to build their query.

A default generative AI-based tool GUI has the following features divided into user customizable and default collateral. User customizable fields include:

Description (query) entry: users can type in natural language what they want the LLM to generate as code.

Custom context button: creates popup window where users can provide additional information or constraints for the query, such as struct definitions or variables.

Edit instructions button: creates popup window where users can adjust the default query instructions that are sent to the LLM.

Default components may include:

Generated code section: users can see the output of the LLM in response to the query. The generated code section is editable, so users can modify the code as they wish before accepting it.

Accept button: users confirm that they are satisfied with the text in the generated code section and add it to the blob storage that supplies the entries for the index.

View RAG Entries button: creates popup window where users can [view] the entries from the index that were retrieved during the RAG flow and used as part of the prompt for the generated code.

Update Index button: add all new entries in the blob storage to the index so that they are accessible in future queries.

As mentioned above, an advantageous approach to generative AI may be achieved through a bottoms-up approach where the user deconstructs a problem into the component parts, asks the AI to solve each component and then asks the AI to synthesize the component solutions into a larger solution. The facilitate this, the generative AI-based tool architecture can be used to build a generative AI-based tool of generative AI-based tools. This approach may be leveraged by the Coverage and Formal Verification generative AI-based tools, as examples. For instance, the task of building coverage collateral is staged to use generative AI to build (1) individual covergroups and coverpoints, (2) coverage modules composed of the covergroups and coverpoints, and then (3) bind modules to connect the coverage modules to the design. The cover property, coverage module, and bind module generative AI-based tools each query and contribute to separate indexes that are specific to their syntax requirements. A similar approach may be used in the Formal Verification generative AI-based tool described above, for example. The formal property generative AI-based tool and the coverage property generative AI-based tool may use the same code except that the default instructions are different, and they use separate index data for code generation. The property module and bind module generative AI-based tools may include the same code base and the same index data as the Coverage generative AI-based tool.

The following describes an example process for creating an index from existing collateral. It will explain how to select, format, and upload the collateral, how to specify the metadata and keywords for the index, and how to test and validate the index.

First, an example field structure of the index for the RAG is described. For instance, each document in the index has the following fields:

Query: The natural language prompt that the user gives to the LLM as input. It describes the collateral that the user wants the LLM to generate. For the coverage generative AI-based tool, the description field would have the description of a cover property for a testplan entry. For the formal verification generative AI-based tool, the description would be for an assert property pertaining to an RTL module.

Context: The optional extra information that the user can provide, such as code snippets, signal struct definitions, or background knowledge, to help the LLM generate more accurate and relevant responses.

Instructions: Used to give the LLM a role, how best to complete that role and any other expectations the user has about the style, format, or completeness of the response. There are default instructions for each generative AI-based tool that the user can override or modify with the "Edit instructions" button.

Module: The Verilog module that the query:response belongs to. Depending on the generative AI-based tool, the module code may be provided as part of the prompt to help the LLM create a better response.

Generated_response: The generated code response that the LLM generates based on the query, context, and instructions.

Accepted_response: The response that the user accepts as correct or satisfactory for their programming task or domain. It can be the same as the generated_response, or it can be modified, corrected, or improved by the user.

Contributor: The employee ID of the person who contributed the entry in the index, used to track the source and quality of the index collateral.

Id: The unique identifier of the document in the index. It can help the user to access, update, or delete the index entry. This entry is generated when the collateral is accepted.

When a new generative AI-based tool is created, the user can choose which of these fields or combinations of these fields are used as part of the index lookup. This gives the user flexibility and control over how the RAG infrastructure searches for the best matching documents in the index. In this example generative AI-based tool architecture, the default fields for index lookup are "query" and "context". The default fields from each entry that are used as part of the prompt engineering process are "instructions", "context" "query", and "accepted_response". Each generative AI-based tool instance can adjust these as desired by the user.

When a new generative AI-based tool is initially created, the index is empty. To quickly create an index so that users can benefit from the RAG infrastructure, existing collateral from other projects may be directly loaded. The generative AI-based tool creator may create query:response pairs that can be entered into the generative AI-based tool and added into the index with the "Accept" button. In some example embodiments, an index with about 30 entries may boost functional and syntactic accuracy of responses from the LLM by about 90%. The size of the index required to provide measurable benefits to the user may be dependent upon how well user queries map to content stored in the index and how much innate domain syntax knowledge the LLM contains.

After initial seeding of the index, new users will receive better responses from the LLM than they would without the RAG system. When LLM responses do not meet user needs for reasons of style, functionality or syntax, the user can either regenerate the response with the current generative AI-based tool settings, edit the generative AI-based tool fields before regenerating, or manually edit the response.

The generative AI process is inherently stochastic so regenerating may yield a different response that may better meet the user's needs. A user may also choose to edit the fields in the generative AI-based tool to give the LLM more detailed information to help generate a better response. For example, when creating functional coverage of signals defined as "structs", the user may observe that the LLM responses display no knowledge of the "struct" definition. In these instances, the LLM will require knowledge of the struct definition since it is likely not currently available in the index. This information can be added by the user through the "custom context" button on the GUI.

If the response from the LLM is close but not quite what the user desires, the response can be manually edited in the "Generated Code" window. Pressing the "Accept" button will commit the current generative AI-based tool information to the blob storage for the index to make the query: response information available to future users through the RAG architecture. The tool stores both the "generated_response" and the "accepted_response" in the index. These will converge as more users leverage the generative AI-based tool and commit high quality responses to the index.

Index Usage and Prompt Engineering

This section will explain how the responses from the RAG infrastructure are used in the prompt engineering process and how the information is passed to the LLM. The prompt engineering process is the method of transforming the user input and the index lookup results into a suitable input for the LLM. The goal is to provide the LLM with enough context and guidance to generate high-quality responses that match the user's expectations and needs. This entire process is managed by the generative AI-based tool and requires no user input.

Figure 11:
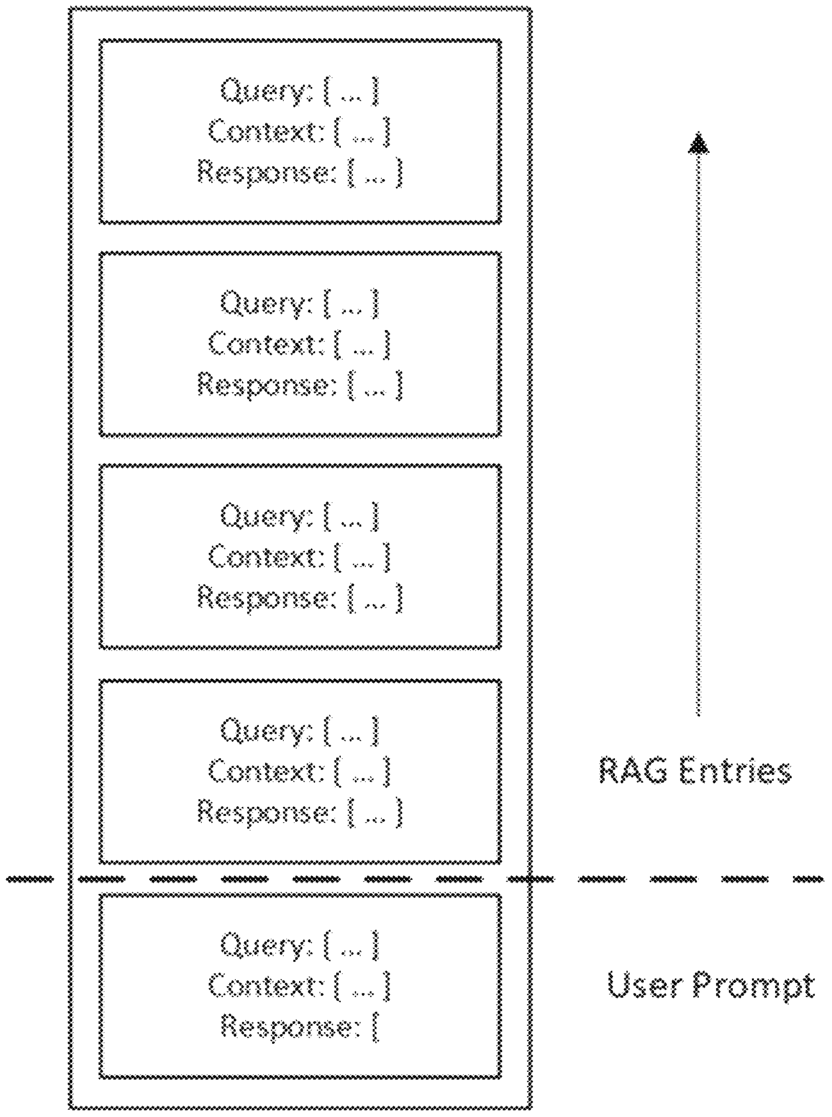
FIG. 11 illustrates an example generative AI-based tool generated LLM input according to an embodiment.

The prompt engineering process consists of the following steps:

1. The user adds the description and any relevant context to the generative AI-based tool and pushes the "Generate" button. The generative AI-based tool constructs the query to the RAG infrastructure based on the fields chosen for that particular generative AI-based tool.
2. The RAG infrastructure performs an index lookup and returns the top k matching index entries from the index. Each index entry contains all the fields previously described in this document, as well as a relevance score indicating how well the index entry matches the user input.
3. The generative AI-based tool infrastructure extracts relevant fields from the index entries and ensures that these selected entries and the rest of the prompt combine to fit within the token window for this LLM model. If the index entries are too large for the allowed token window, the generative AI-based tool will choose the best subset of index entries that fits within the token window. In one embodiment, the best subset of index entries may be selected based on cosine similarity that compares the vectorization of the query with the vectors in the database and returns a sorted list based on the highest value of cosine similarity.
4. The generative AI-based tool constructs a final input for the LLM from the RAG entries and the user's specific query. An example input is shown in FIG. 11.
5. The LLM receives the final input, generates a response and populates the "Generated Code" window. The user can then regenerate or modify the response before accepting it. If the user accepts the response, it is stored in the index with other data scraped from the generative AI-based tool.

In one example implementation, a generative AI-based tool code base is class based and widgetized, allowing users to create new domain-specific syntax generative AI-based tools in minutes that are connected to customized and secure other resources for that generative AI-based tool. New tented blob storage and indices are generated on-demand by new generative AI-based tool deployments.

The generative AI-based tools provide the following benefits to design and verification teams.

1. Remove mundane, tedious, repetitive work to allow engineers to focus on the harder and more interesting engineering problems.
2. Remove the burden of syntax much like compiler removed the burden of machine language to allow people to code in more abstract languages.
3. Give users access to expert knowledge in diverse domains.

The output of the generative AI-based tools improves continuously as users use them and contribute more information into the supporting data index. A description of the index fields and how to start creating a new one is included.

Figure 12:
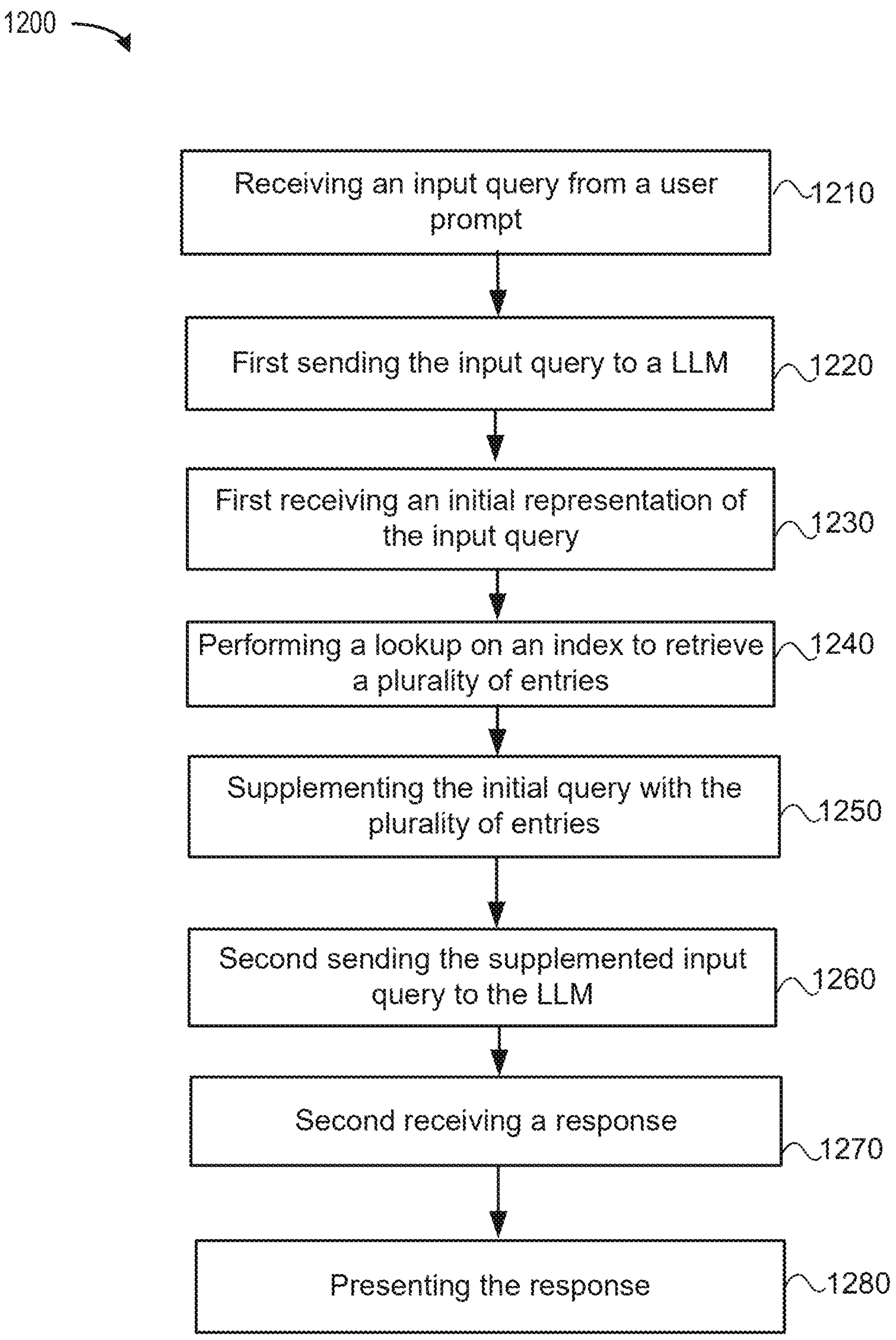
FIG. 12 illustrates a flowchart for a generative AI-based tool according to an embodiment.

FIG. 12 illustrates a flowchart for a generative AI-based tool according to one embodiment. Flowchart 1200 can may be implemented in computer readable code and executed by a processor within a computer system. Flowchart 1200 begins by receiving an input query from a user prompt at 1210. The input query can be in natural language, provided by a user that is not an expert in the domain specific code syntax for the programming environment. In one example, the input query may be a verification specification or a description. The input query is sent to an LLM at 1220. The LLM may in turn process the input query and generate an output that is an initial representation of the input query. The initial representation may be a vectorization of the input query so that the input query is in a format that can be received by an index. Flowchart 1200 continues by receiving the initial representation of the input query at 1230 and then performs a look up on an index to retrieve a plurality of entries at 1250. The index may be unique to the generative AI-based tool and be configured to store code snippets, API references, or code examples for the domain specific code syntax. The plurality of entries retrieved may be examples of code in the domain specific code syntax that can be used as examples to further seed the input query, thus improving the results of the LLM. Flowchart 1200 continues by supplementing the initial query with the plurality of entries. This may include appending the plurality of entries to the initial query as examples of code in the domain specific syntax that the response to the initial query should be in. In one embodiment, the input query has defined an allowed token size that the input query has to be smaller than. If an allowed token size has been defined, then supplementing the input query may include generating a supplemented input query that is smaller than the allowed token size. This may include ranking the plurality of entries and including the entries with the highest ranking, up to the allowed token size. Flowchart 1200 then continues by sending the supplemented input query to the LLM at 1260 and receiving a response from the LLM at 1270. The response should be in the domain specific code syntax. The response may then be presented at 1280, for example in a graphical user interface. The user may review the response and decide whether to accept the response or to edit the response. Once the response has been approved by the user, the approved response, along with the input query, may be stored in the index to incrementally improve future search results since this new entry in the index may be used later to seed future inquiries to the LLM.

Figure 13:
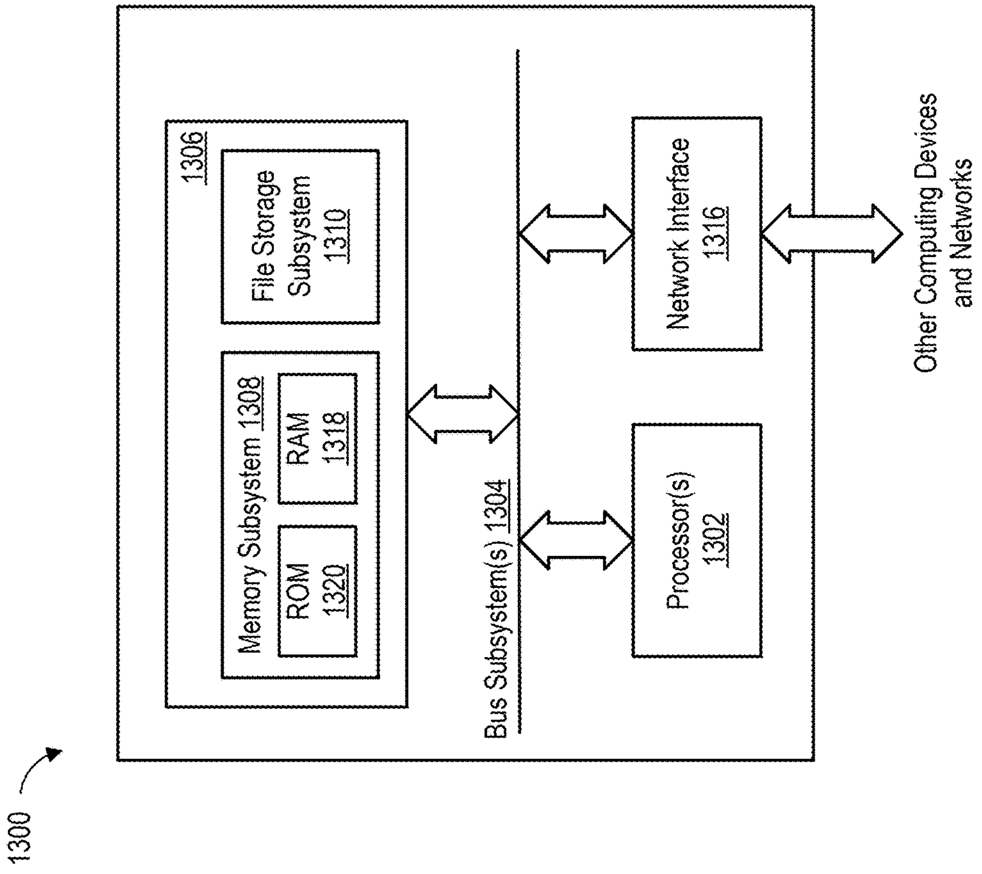
FIG. 13 depicts a simplified block diagram of an example computer system, which can be used to implement some of the techniques described in the foregoing disclosure.

FIG. 13 depicts a simplified block diagram of an example computer system, which can be used to implement some of the techniques described in the foregoing disclosure. As shown in FIG. 13, system 1300 includes one or more processors 1302 that communicate with several devices via one or more bus subsystems 1304. These devices may include a storage subsystem 1306 (e.g., comprising a memory subsystem 1308 and a file storage subsystem 1310) and a network interface subsystem 1316. Some systems may further include user interface input devices and/or user interface output devices (not shown).

Bus subsystem 1304 can provide a mechanism for letting the various components and subsystems of system 1300 communicate with each other as intended. Although bus subsystem 1304 is shown schematically as a single bus, alternative embodiments of the bus subsystem can utilize multiple buses.

Network interface subsystem 1316 can serve as an interface for communicating data between system 1300 and other computer systems or networks. Embodiments of network interface subsystem 1316 can include, e.g., Ethernet, a Wi-Fi and/or cellular adapter, a modem (telephone, satellite, cable, etc.), and/or the like.

Storage subsystem 1306 includes a memory subsystem 1308 and a file/disk storage subsystem 1310. Subsystems 1308 and 1310 as well as other memories described herein are examples of non-transitory computer-readable storage media that can store executable program code and/or data that provide the functionality of embodiments of the present disclosure.

Memory subsystem 1308 comprise one or more memories including a main random access memory (RAM) 1318 for storage of instructions and data during program execution and a read-only memory (ROM) 1320 in which fixed instructions are stored. File storage subsystem 1310 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that system 1300 is illustrative and many other configurations having more or fewer components than system 1300 are possible.

The above description illustrates various embodiments of the present invention along with examples of how aspects of the present invention may be implemented. The above examples and embodiments should not be deemed to be the only embodiments and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

Further Examples

Each of the following non-limiting features in the following examples may stand on its own or may be combined in various permutations or combinations with one or more of the other features in the examples below. Embodiments of the present disclosure may include systems, circuits, and methods.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations, and equivalents may be employed without departing from the scope hereof as defined by the claims.

In some embodiments, a method, comprising receiving an input query from a user prompt, first sending the input query to a large language model (LLM), first receiving, from the LLM, an initial representation of the input query, performing a lookup on an index to retrieve a plurality of entries that are relevant to the initial representation, wherein each of the plurality of entries follow a domain specific code syntax, supplementing the input query with the plurality of entries, second sending the supplemented input query to the LLM, second receiving, from the LLM, a response corresponding to the supplemented input query, and presenting the response on a graphical user interface.

In one embodiment, the response includes software code that follows the domain specific code syntax.

In one embodiment, the method further includes receiving, from the graphical user interface, an acceptance of the response and saving the response along with the input query in the index based on the acceptance.

In one embodiment, the lookup on the index is based on at least one field in the initial representation.

In one embodiment, the at least one field includes one of the following: query, context, instructions, module, generated response, accepted response, contributor, and Id.

In one embodiment, each of the plurality of entries include the at least one field.

In one embodiment, the plurality of entries include a code snippet, an API reference, or a code example.

In one embodiment, performing the lookup comprises: generating a vectorized query from the initial representation, retrieving a set of relevant entries from the index based on the vectorized query, ranking the set of relevant entries according to how each entry matches the input query, and selecting the plurality of entries from the set of entries according to the ranking.

In one embodiment, supplementing the input query comprises: determining that the input query plus the plurality of entries is larger than an allowed token window and combining the input query and a subset of the plurality of entries to generate the supplemented input query such that the supplemented input query is smaller than the allowed token window.

In some embodiments, a method, comprising receiving an input query from a user prompt, first sending the input query to a large language model (LLM), first receiving, from the LLM, an initial representation of the input query, performing a lookup on an index to retrieve a plurality of entries that are relevant to the initial representation, wherein each of the plurality of entries follow a domain specific code syntax, supplementing the input query with the plurality of entries, second sending the supplemented input query to the LLM, second receiving, from the LLM, a response corresponding to the supplemented input query, and presenting the response on a graphical user interface.

In some embodiments, a non-transitory computer-readable medium stores a program executable by one or more processors, the program comprises sets of instructions for: receiving an input query from a user prompt, first sending the input query to a large language model (LLM), first receiving, from the LLM, an initial representation of the input query, performing a lookup on an index to retrieve a plurality of entries that are relevant to the initial representation, wherein each of the plurality of entries follow a domain specific code syntax, supplementing the input query with the plurality of entries, second sending the supplemented input query to the LLM, second receiving, from the LLM, a response corresponding to the supplemented input query, and presenting the response on a graphical user interface.

What is claimed is:

1. A method, comprising:

receiving an input query from a user prompt;

sending the input query to a large language model (LLM);

receiving, from the LLM, an initial representation of the input query;

performing, based on the initial representation, a lookup on an index storing a plurality of entries, wherein each of the plurality of entries in the index follows a domain specific code syntax, and performing the lookup comprises:

retrieving, from the index, a plurality of relevant entries based on the initial representation; and ranking the plurality of relevant entries according to how each entry matches the input query;

supplementing the input query with at least some of the plurality of relevant entries, including:

determining that a token count of the input query plus a token count of the plurality of relevant entries exceeds an allowed token window of the LLM;

selecting, from the plurality of relevant entries and in accordance with the ranking, a subset of the plurality of relevant entries such that a combined token count of the input query and the subset does not exceed the allowed token window of the LLM; and combining the input query and the subset of the plurality of relevant entries to generate a supplemented input query:

sending the supplemented input query to the LLM;

receiving, from the LLM, a response corresponding to the supplemented input query; and presenting the response on a graphical user interface.

2. The method of claim 1, wherein the response includes software code that follows the domain specific code syntax.

3. The method of claim 1, further comprising:

receiving, from the graphical user interface, an acceptance of the response; and saving the response along with the input query in the index based on the acceptance.

4. The method of claim 1, wherein the lookup on the index is based on at least one field in the initial representation.

5. The method of claim 4, wherein the at least one field is a query field, a context field, an instructions field, a module field, a generated response field, an accepted response field, a contributor field, or an ID field.

6. The method of claim 5, wherein each of the plurality of entries includes the at least one field.

7. The method of claim 6, wherein the plurality of entries includes a code snippet, an API reference, or a code example.

8. The method of claim 1, wherein performing the lookup comprises:

generating a vectorized query from the initial representation.

9. The method of claim 1, wherein the subset of the plurality of relevant entries comprises highest-ranked entries admitted in rank order according to how each entry matches the input query until adding a further entry would exceed the allowed token window.

10. A system comprising:

one or more processors;

a non-transitory computer-readable medium storing a program executable by the one or more processors, the program comprising sets of instructions for:

receiving an input query from a user prompt;

sending the input query to a large language model (LLM);

receiving, from the LLM, an initial representation of the input query;

performing, based on the initial representation, a lookup on an index storing a plurality of entries, wherein each of the plurality of entries in the index follows a domain specific code syntax, and performing the lookup comprises:

retrieving, from the index, a plurality of relevant entries based on the initial representation; and ranking the plurality of relevant entries according to how each entry matches the input query;

supplementing the input query with at least some of the plurality of relevant entries, including:

determining that a token count of the input query plus a token count of the plurality of relevant entries exceeds an allowed token window of the LLM;

selecting, from the plurality of relevant entries and in accordance with the ranking, a subset of the plurality of relevant entries such that a combined token count of the input query and the subset does not exceed the allowed token window of the LLM; and combining the input query and the subset of the plurality of relevant entries to generate a supplemented input query;

sending the supplemented input query to the LLM;

receiving, from the LLM, a response corresponding to the supplemented input query; and presenting the response on a graphical user interface.

11. The system of claim 10, wherein the response includes software code that follows the domain specific code syntax.

12. The system of claim 10, wherein the program further comprises sets of instructions for:

receiving, from the graphical user interface, an acceptance of the response; and saving the response along with the input query in the index based on the acceptance.

13. The system of claim 10, wherein the lookup on the index is based on at least one field in the initial representation.

14. The system of claim 13, wherein the at least one field is a query field, a context field, an instructions field, a module field, a generated response field, an accepted response field, a contributor field, or an ID field.

15. The system of claim 10, wherein performing the lookup comprises:

generating a vectorized query from the initial representation.

16. A non-transitory computer-readable medium storing a program executable by one or more processors, the program comprising sets of instructions for:

receiving an input query from a user prompt;

sending the input query to a large language model (LLM);

receiving, from the LLM, an initial representation of the input query;

performing, based on the initial representation, a lookup on an index storing a plurality of entries, wherein each of the plurality of entries in the index follows a domain specific code syntax, and performing the lookup comprises:

retrieving, from the index, a plurality of relevant entries based on the initial representation; and ranking the plurality of relevant entries according to how each entry matches the input query;

supplementing the input query with at least some of the plurality of relevant entries, including:

determining that a token count of the input query plus a token count of the plurality of relevant entries exceeds an allowed token window of the LLM;

selecting, from the plurality of relevant entries and in accordance with the ranking, a subset of the plurality of relevant entries such that a combined token count of the input query and the subset does not exceed the allowed token window of the LLM; and combining the input query and the subset of the plurality of relevant entries to generate a supplemented input query;

sending the supplemented input query to the LLM;

receiving, from the LLM, a response corresponding to the supplemented input query; and presenting the response on a graphical user interface.

17. The non-transitory computer-readable medium of claim 16, wherein the program further comprises sets of instructions for:

receiving, from the graphical user interface, an acceptance of the response; and saving the response along with the input query in the index based on the acceptance.

18. The non-transitory computer-readable medium of claim 16, wherein the lookup on the index is based on at least one field in the initial representation.

19. The non-transitory computer-readable medium of claim 18, wherein the at least one field is a query field, a context field, an instructions field, a module field, a generated response field, an accepted response field, a contributor field, or an ID field.

20. The non-transitory computer-readable medium of claim 16, wherein performing the lookup comprises:

generating a vectorized query from the initial representation.

* * * * *